(12) United States Patent
Choi

(10) Patent No.: US 9,508,406 B2
(45) Date of Patent: Nov. 29, 2016

(54) DRIVING APPARATUS AND SELECTION OF A DEAD ZONE OF AN INTERNAL VOLTAGE

(71) Applicant: SK hynix Inc., Icheon-si Gyeonggi-do (KR)

(72) Inventor: Young Koung Choi, Suwon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/683,869

(22) Filed: Apr. 10, 2015

(65) Prior Publication Data

US 2016/0118092 A1    Apr. 28, 2016

(30) Foreign Application Priority Data

Oct. 23, 2014  (KR) .................. 10-2014-0144148

(51) Int. Cl.
*G11C 7/00*  (2006.01)
*G11C 7/12*  (2006.01)
*G11C 5/14*  (2006.01)

(52) U.S. Cl.
CPC  *G11C 7/12* (2013.01); *G11C 5/147* (2013.01)

(58) Field of Classification Search
CPC ........................................... G11C 7/00
USPC .................................. 365/189.011–208
See application file for complete search history.

(56) References Cited

U.S. PATENT DOCUMENTS

| 6,504,783 B2 * | 1/2003 | Jo | .......... G11C 8/08 365/194 |
| 2002/0060943 A1 * | 5/2002 | Jo | .......... G11C 8/08 365/226 |

FOREIGN PATENT DOCUMENTS

KR    1020090001245 A    1/2009

* cited by examiner

*Primary Examiner* — Harry W Byrne
(74) *Attorney, Agent, or Firm* — William Park & Associates Ltd.

(57) ABSTRACT

A driving apparatus includes a control circuit configured to generate a voltage region control signal enabled for a predetermined time according to a command signal; and a driving circuit configured to provide an internal voltage by selecting a dead zone of the internal voltage according to the voltage region control signal.

20 Claims, 5 Drawing Sheets

DRIVING APPARATUS AND SELECTION OF A DEAD ZONE OF AN INTERNAL VOLTAGE

CROSS-REFERENCES TO RELATED APPLICATION

The present application claims priority under 35 U.S.C. §119(a) to Korean application number 10-2014-0144148, filed on Oct. 23, 2014, in the Korean Intellectual Property Office, which is incorporated herein by reference in its entirety.

BACKGROUND

1. Technical Field

Various embodiments generally relate to a driving apparatus, and more particularly, to a driving apparatus which selects a dead zone for a predetermined time in response to a command signal and drives an internal voltage.

2. Related Art

An electronic device may have disposed therein a memory apparatus for storing data. A characteristic with which data are stored in the memory apparatus may be determined by various parameters.

An internal voltage necessary for the operation of the electronic device may be provided by being driven through performing a pull-up or pull-down operation between a ground voltage and a power supply voltage. In this regard, since pull-up and pull-down may be simultaneously performed, a dead zone may be set between voltages serving as references for performing the pull-up and the pull-down.

SUMMARY

In an embodiment, a driving apparatus may include a control circuit configured to generate a voltage region control signal enabled for a predetermined time according to a command signal. The driving apparatus may also include a driving circuit configured to provide an internal voltage by selecting a dead zone of the internal voltage according to the voltage region control signal.

In an embodiment, a driving apparatus may include a control circuit configured to decode a command signal and generate a voltage region control signal enabled from a predetermined time from when a bank of memory cells to which an internal voltage is provided is precharged. The driving apparatus may also include a driving circuit configured to select a dead zone of the internal voltage according to the voltage region control and provide the internal voltage according to the selected dead zone.

The driving circuit may lower a dead zone region to drive the internal voltage according to a bit line equalization signal.

In an embodiment, a driving apparatus may include a control circuit configured to generate a voltage region control signal and control a time through which the voltage region control signal is enabled according to device characteristics. The driving apparatus may also include a driving circuit configured to selectively change a dead zone region to drive an internal voltage for a predetermined time from when a bank is started to be precharged through a bit line in response to the voltage region control signal.

The control circuit may generate the voltage region control signal in synchronization with a bit line equalization signal. The control circuit may lower a dead zone within which driving devices operate.

The driving devices do not operate when the internal voltage has a value substantially similar to a value of the selected upper voltage but less than the value of the selected upper voltage.

A first upper voltage may be greater than a second upper voltage, and the internal voltage may be lowered to a ground voltage when the second upper voltage is a selected upper voltage.

DETAILED DESCRIPTION

Hereinafter, a driving apparatus will be described below with reference to accompanying figures through various embodiments. Various embodiments are directed to a driving apparatus which may selectively control a dead zone to prevent an internal voltage from increasing in the dead zone. In addition, various embodiments are directed to a driving apparatus which may selectively control a dead zone and thereby quickly stabilize a voltage with a level close to a limit of the dead zone before control. Further, various embodiments are directed to a driving apparatus which may increase a dead zone control speed when selectively controlling a dead zone. According to the embodiments, the driving apparatus may prevent an internal voltage from increasing in a dead zone and thereby stably provide the internal voltage. Where the internal voltage is used as a voltage serving as a reference for determining the data value of a memory apparatus, the precision of determining data may be improved by preventing the internal voltage from increasing.

Figure 1:
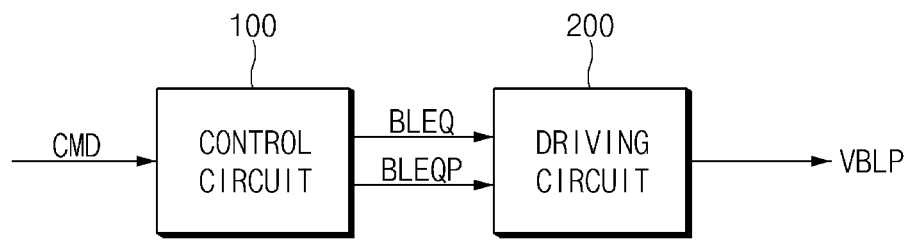
FIG. 1 is a block diagram illustrating a representation of an example of a driving apparatus in accordance with an embodiment.

Referring to FIG. 1, a block diagram illustrating a representation of an example of a driving apparatus in accordance with an embodiment is shown.

In FIG. 1, a driving apparatus 10 may include a control circuit 100 and a driving circuit 200.

The control circuit 100 generates a voltage region control signal BLEQP enabled for a predetermined time, based on a command signal CMD. For example, the driving apparatus 10 may be realized to be electrically coupled with a memory apparatus 400 (see FIG. 5) and provide an internal voltage VBLP to the memory apparatus 400.

The control circuit 100 may decode the command signal CMD by including a command decoder or the like. The control circuit 100 may also generate control signals for bank activation, precharge, and so forth, to perform operations such as read, write and refresh operations for the memory apparatus 400. In addition, the control circuit 100 may provide information on addresses for which such operations are to be performed, to the memory apparatus 400, and may activate a certain bank.

According to an embodiment, the control circuit 100 may generate the voltage region control signal BLEQP enabled for the predetermined time from a time when a bank of memory cells to be provided with the internal voltage VBLP is precharged according to a command signal CMD. For example, the control circuit 100 may control a time through which the voltage region control signal BLEQP is enabled, according to device characteristics and the likes of the driving circuit 200.

According to an embodiment, the control circuit 100 may determine a time at which the bank of memory cells is charged according to the bit line equalization signal BLEQ. According to this fact, the control circuit 100 may generate the voltage region control signal BLEQP enabled for the predetermined time in synchronization with the bit line equalization signal BLEQ. The control circuit 100 may generate the voltage region control signal BLEQP according to the bit line equalization signal BLEQ generated based on the command signal CMD.

The driving circuit 200 may select the dead zone of the internal voltage VBLP according to the voltage region control signal BLEQP. The driving circuit 200 may also provide the internal voltage VBLP through driving according to the selected dead zone. Accordingly, the driving circuit 200 may be configured to provide the internal voltage VBLP by selecting the dead zone of the internal voltage VBLP according to the voltage region control signal BLEQP.

For example, the internal voltage VBLP may correspond to a bit line precharge voltage. The bit line precharge voltage is provided to bit lines according to the bit line equalization signal BLEQ in a bit line precharge operation. The bit line precharge voltage may usually have a value corresponding to ½ of a core voltage or a power supply voltage.

The bit line precharge voltage may serve as a reference value to determine a high or low data value or a start voltage for writing data in memory cells through a bit line.

In this regard, when writing data in memory cells, a driving scheme capable of improving data writability for memory cells or lengthening a data retention time by overdriving signals to be provided to a sense amplifier electrically coupled with a bit line, for a preset time immediately before the bit line equalization signal BLEQ is enabled, may be used. Such a driving scheme may be referred to as a post overdriving scheme.

Where the operation of overdriving the bit line before the bit line equalization signal BLEQ is enabled is continuously implemented, as the bit line and a node for providing the internal voltage VBLP are electrically coupled by the bit line equalization signal BLEQ, the internal voltage VBLP may be provided to the bit line. Consequently, current may continuously flow to the node of the driving circuit 200 which provides the internal voltage VBLP through the overdriven bit line.

In this instance, the internal voltage VBLP may continuously increase. Furthermore, a time required to pull down the internal voltage VBLP which has increased, after the bit line equalization signal BLEQ is enabled, may become long. Due to this phenomenon, the internal voltage VBLP serving as a reference value to determine a high or low value of data may be lopsided to a high value, whereby a fail may occur when reading high data.

The driving circuit in accordance with an embodiment selectively changes a dead zone region to drive the internal voltage VBLP, for the predetermined time from a time when a bank is started to be precharged through a bit line, according to the voltage region control signal BLEQP provided from the control circuit 100. For example, the driving circuit 200 may lower a dead zone region to drive the internal voltage VBLP, for the predetermined time, in response to the bit line equalization signal BLEQ.

Figure 2:
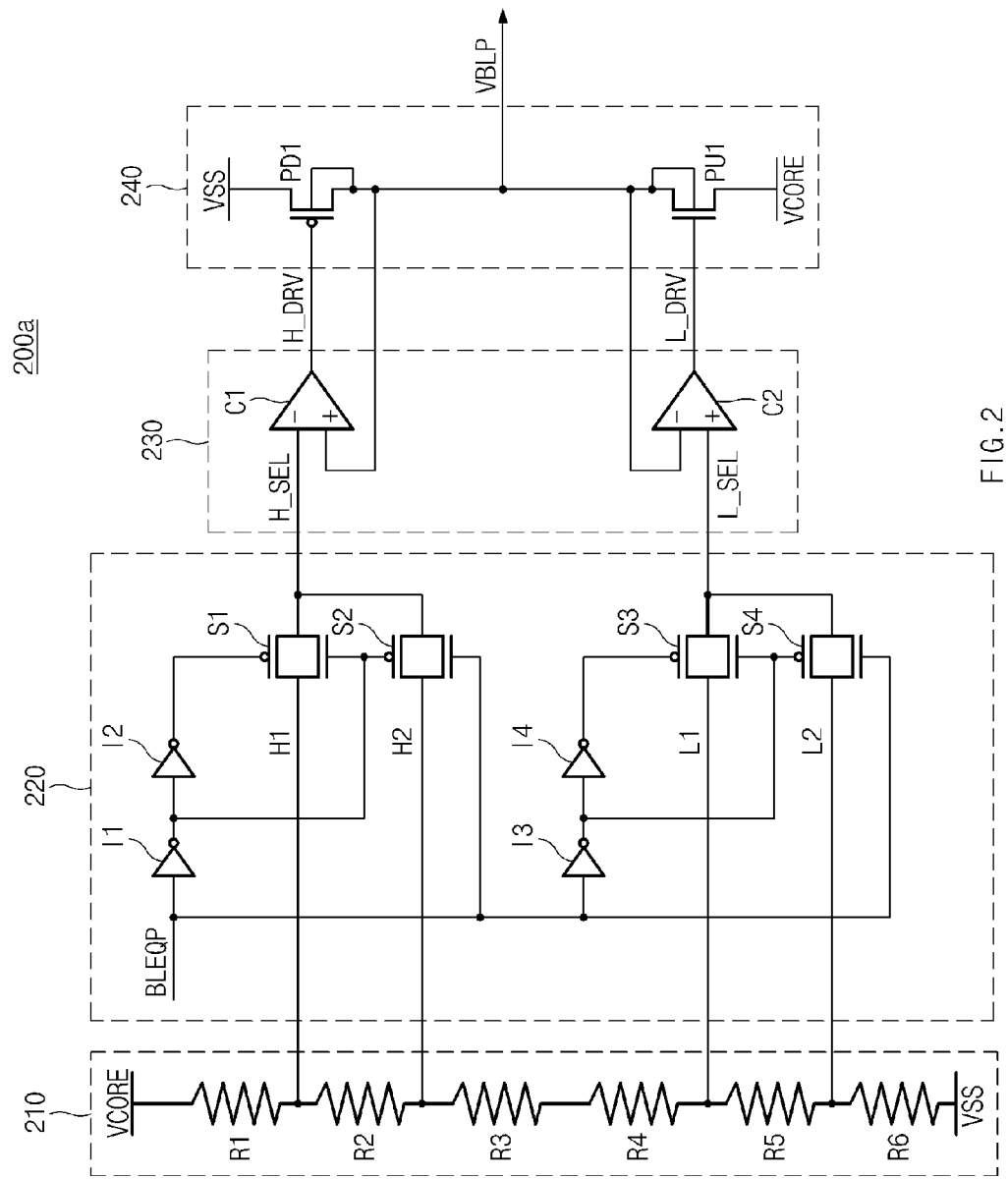
FIG. 2 is a diagram illustrating a representation of an embodiment of the driving circuit included in the driving apparatus.

Referring to FIG. 2, a diagram illustrating a representation of an embodiment of the driving circuit included in the driving apparatus is shown.

In FIG. 2, a driving circuit 200a may include a voltage division circuit 210, a driving range select circuit 220, a comparison circuit 230, and driving devices 240.

The voltage division circuit 210 is configured by a plurality of resistors R1, . . . , R6 electrically coupled between a core voltage VCORE and a ground voltage VSS. The voltage division circuit 210 may divide the core voltage VCORE and provide a plurality of upper voltages H1 and H2 and a plurality of lower voltages L1 and L2. While it is shown as an example in FIG. 2 that the voltage division circuit 210 provides two upper voltages H1 and H2 and two lower voltages L1 and L2, it is to be noted that the embodiment is not limited to such an example.

The driving range select circuit 220 provides one of the upper voltages H1 and H2 as a selected upper voltage H_SEL. The driving range select circuit 220 also provides one of the lower voltages L1 and L2 as a selected lower voltage L_SEL in response to the voltage region control signal BLEQP.

In particular, the driving range select circuit 220 includes a plurality of inverters I1, I2, I3 and I4 for complementarily providing the voltage region control signal BLEQP. The driving range select circuit 220 further includes switches S1, S2, S3 and S4 to which the voltage region control signal BLEQP is complementarily provided. Therefore, at an identical time, the first switch S1 and the third switch S3 may operate in substantially the same way. In addition, the second switch S2 and the fourth switch S4 may operate in substantially the same way.

The first switch S1 may be turned on when the voltage region control signal BLEQP is disabled and provide the first upper voltage H1 as the selected upper voltage H_SEL. Further, the second switch S2 may be turned on when the voltage region control signal BLEQP is enabled and provide the second upper voltage H2 as the selected upper voltage H_SEL.

The third switch S3, which simultaneously operates with the first switch S1, may be turned on when the voltage region control signal BLEQP is disabled and provide the first lower voltage L1 as the selected lower voltage L_SEL. Further, the fourth switch S4, which simultaneously operates with the second switch S2, may be turned on when the voltage region control signal BLEQP is enabled and provide the second lower voltage L2 as the selected lower voltage L_SEL.

Thus, according to the driving range select circuit 220, the pair of the first upper voltage H1 and the first lower voltage L1 or the pair of the second upper voltage H2 and the second lower voltage L2 are provided as the selected upper voltage H_SEL and the selected lower voltage L_SEL to the comparison circuit 230.

According to an embodiment, the difference between the first upper voltage H1 and the first lower voltage L1 may be equal to the difference between the second upper voltage H2 and the second lower voltage L2.

The comparison circuit 230 may compare the selected upper voltage H_SEL and the selected lower voltage L_SEL with the internal voltage VBLP. The comparison circuit 230 may also provide an upper driving signal H_DRV and a lower driving signal L_DRV.

The comparison circuit 230 may include a first comparator C1 which compares the selected upper voltage H_SEL and the internal voltage VBLP and provides the upper driving signal H_DRV. The comparison circuit 230 may also include a second comparator C2 which compares the selected lower voltage L_SEL and the internal voltage VBLP and provides the lower driving signal L_DRV.

The first comparator C1 generates the upper driving signal H_DRV to pull down the internal voltage VBLP toward the ground voltage VSS where the internal voltage VBLP is larger than the selected upper voltage H_SEL. More specifically, the first comparator C1 provides the upper driving signal H_DRV which is disabled when the internal voltage VBLP is smaller than the selected upper voltage H_SEL and is enabled when the internal voltage VBLP is larger than the selected upper voltage H_SEL.

The second comparator C2 operates to generate the lower driving signal L_DRV enabled when the internal voltage VBLP is smaller than the selected lower voltage L_SEL and pull up the internal voltage VBLP toward the core voltage VCORE.

The driving devices 240 pull down the internal voltage VBLP to the level of the ground voltage VSS and pull up the internal voltage VBLP to the level of the core voltage VCORE, in response to the upper driving signal H_DRV and the lower driving signal L_DRV, respectively. The driving devices 240 may be configured to provide the internal voltage VBLP according to the upper driving signal H_DRV and the lower driving signal L_DRV respectively.

The driving devices 240 may include a first pull-down device PD1 electrically coupled between the ground voltage VSS and the internal voltage VBLP and configured to perform a pull-down operation in response to the upper driving signal H_DRV. The driving devices 240 may also include a first pull-up device PU1 electrically coupled between the core voltage VCORE and the internal voltage VBLP and configured to perform a pull-up operation in response to the lower driving signal L_DRV.

As described above, the upper driving signal H_DRV turns on the pull-down device PD1 where the internal voltage VBLP is larger than the selected upper voltage H_SEL. In addition, the lower driving signal L_DRV turns on the pull-up device PU1 where the internal voltage VBLP is smaller than the selected lower voltage L_SEL.

The driving devices 240 do not operate between the selected lower voltage L_SEL and the selected upper voltage H_SEL even though the internal voltage VBLP is changed. Accordingly, the voltage region between the selected lower voltage L_SEL and the selected upper voltage H_SEL is referred to as a dead zone.

The dead zone region may have a meaning as a safety region to prevent the driving devices 240 from being simultaneously turned on at any moment and thus the core voltage VCORE and the ground voltage VSS from being electrically coupled to allow the internal voltage VBLP to have an unstable value, because the internal voltage VBLP moves between fine values.

For example, both the pull-up device PU1 and the pull-down device PD1 may be realized by a transistor in which a body and a source are electrically coupled.

For instance, when the internal voltage VBLP has a value substantially close to the selected upper voltage H_SEL in the dead zone but is smaller than the selected upper voltage H_SEL, the driving devices 240 do not operate. Nevertheless, where the internal voltage VBLP is close to the selected upper voltage H_SEL and continuously retains such a high value, a problem may be caused when determining data based on the internal voltage VBLP.

As a result, since the internal voltage VBLP is lopsided to an upper or lower value in the dead zone which is set for the stabilization of the internal voltage VBLP, an error may occur when determining data.

Therefore, the control circuit 100 in accordance with an embodiment, provides the second upper voltage H2 smaller than the first upper voltage H1 and the second lower voltage L2 smaller than the first lower voltage L1, as the selected upper voltage H_SEL and the selected lower voltage L_SEL, respectively, for the predetermined time from a bank precharge time, that is, a bit line precharge time. As a result, the dead zone with which the driving devices 240 may operate is lowered accordingly.

When assuming that the internal voltage VBLP has a value that is not larger than but is close to the first upper voltage H1, the pull-down device PD1 may not operate since the upper driving signal H_DRV is disabled according to comparison of the internal voltage VBLP and the selected upper voltage H_SEL. If the second upper voltage H2 smaller than the first upper voltage H1 is provided as the selected upper voltage H_SEL, because the internal voltage VBLP is larger than the second upper voltage H2, the pull-down device PD1 may be operated and control increase in the internal voltage VBLP.

According to an embodiment, as described above, the difference between the first upper voltage H1 and the first lower voltage L1 may be equal to the difference between the second upper voltage H2 and the second lower voltage L2. This is because a range, in which both the pull-up device PU1 and the pull-down device PD1 do not operate, may be retained and operational stability may be continuously retained, only when the entire range of the dead zone is constant. The driving circuit 200 may provide the internal voltage VBLP by decreasing an upper potential and a lower potential of the dead zone while retaining a range of the dead zone according to the voltage region control signal BLEQP.

Figure 3:
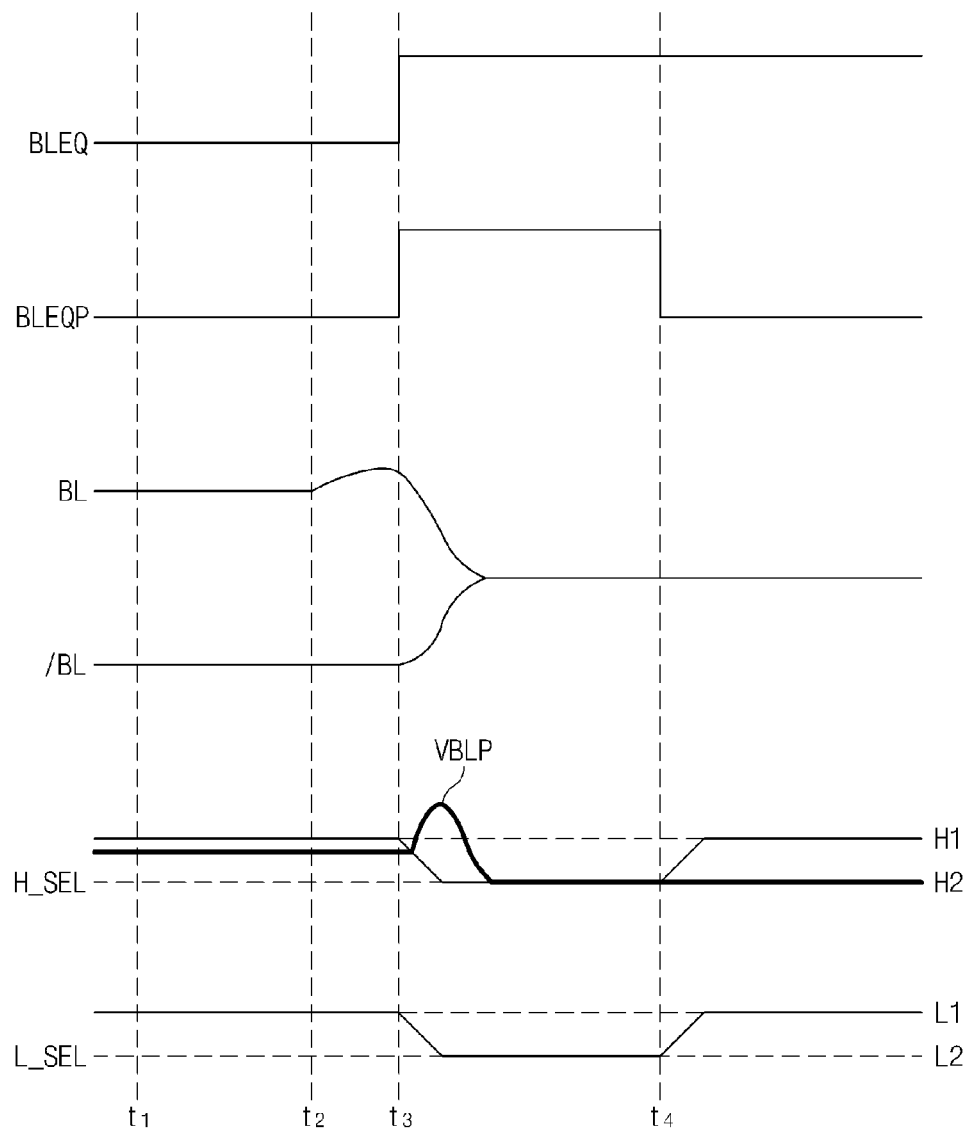
FIG. 3 is a representation of an example of a waveform diagram to assist in the explanation of operations of the driving apparatus in accordance with the embodiment.

Referring to FIG. 3, a representation of an example of a waveform diagram to assist in the explanation of operations of the driving apparatus in accordance with an embodiment is illustrated.

Operations of the driving apparatus in accordance with an embodiment will be described below with reference to FIGS. 1 to 3.

As described above, the control circuit 100 may generate various control signals, based on the command signal CMD. At a time t1, a bank may be in an enabled state to perform a read or write operation based on the command signal CMD. Therefore, the potential difference of a bit line BL and a bit line bar /BL may be increased to define a state in which data are read or written. In other words, while not shown, a word line is enabled and memory cells and the bit line pair BL and /BL are electrically coupled.

The selected upper voltage H_SEL may be selectively changed between the first upper voltage H1 and the second upper voltage H2. In addition, the selected lower voltage L_SEL may be selectively changed between the first lower voltage L1 and the second lower voltage L2.

At the time t1, the first upper voltage H1 corresponds to the selected upper voltage H_SEL. Further, the first lower voltage L1 corresponds to the selected lower voltage L_SEL. The internal voltage VBLP has a value that is close to the first upper voltage H1 but is not larger than the first upper voltage H1.

At a time t2, an operation of overdriving a voltage to be applied to the bit line BL and thereby improving the storage characteristic of the memory cells electrically coupled with the bit line BL may be performed. It may be observed that, through the overdriving operation for increasing the voltage difference between the bit line pair BL and /BL and thereby improving data read or write precision, the potential of the bit line BL is increased. A configuration for performing the overdriving will be described later in detail with reference to FIG. 5.

It is to be understood that a voltage to be provided to memory cells is temporarily increased for the preset time (for example, for the period between the time t2 and a time t3) before the time t3 at which the bank of the memory cells electrically coupled with the bit line BL is precharged.

At the time t3, the control circuit 100 enables the bit line equalization signal BLEQ. In addition, the voltage region control signal BLEQP is enabled in response to the bit line equalization signal BLEQ.

The bit line BL and the bit line bar /BL are electrically coupled and smoothed in response to the bit line equalization signal BLEQ. In the bit line equalization process, as the node of the driving circuit 200 which provides the internal voltage VBLP is electrically coupled with the bit line pair BL and /BL, the temporarily boosted voltage of the bit line BL may be applied to the node from which the internal voltage VBLP is generated. Further, the internal voltage VBLP may abruptly increase.

The driving circuit 200 in accordance with an embodiment drives the internal voltage VBLP by setting the second upper voltage H2 as the selected upper voltage H_SEL and the second lower voltage L2 as the selected lower voltage L_SEL in response to the voltage region control signal BLEQP.

The drivability of the pull-down device PD1 may be proportional to the difference between the selected upper voltage H_SEL and the internal voltage VBLP. Since the second upper voltage H2 has a value smaller than the first upper voltage H1, when the internal voltage VBLP increases, drivability for lowering the internal voltage VBLP to the ground voltage VSS may be increased where the second upper voltage H2 is the selected upper voltage H_SEL. Accordingly, as a speed for pulling down the internal voltage VBLP is increased, the internal voltage VBLP may be stabilized within a short time.

The control circuit 200 disables the voltage region control signal BLEQP at a time t4. Thereby, the dead zone, which is lowered for the predetermined time from the time t3 to the time t4, is raised.

The predetermined time during which the control circuit 200 enables the voltage region control signal BLEQP may be determined according to the operation speed of the comparison circuit 230 of FIG. 2.

For example, if the comparators C1 and C2 which configure the comparison circuit 230 may quickly provide the selected upper voltage H_SEL and the selected lower voltage L_SEL in response to the voltage region control signal BLEQP, a time required to stabilize the internal voltage VBLP may be shortened. Accordingly, a time for enabling the voltage region control signal BLEQP may be decreased.

In an embodiment, the predetermined time during which the control circuit 200 enables the voltage region control signal BLEQP may also be determined according to the drivability of the driving devices 240 of FIG. 2. The drivability of the driving devices 240 may be determined by the size of the pull-up device PU1 and the pull-down device PD1.

If the drivability of the driving devices 240 is large, since a time required to stabilize the internal voltage VBLP is decreased, a time during which the voltage region control signal BLEQP is enabled may be decreased accordingly.

Figure 4:
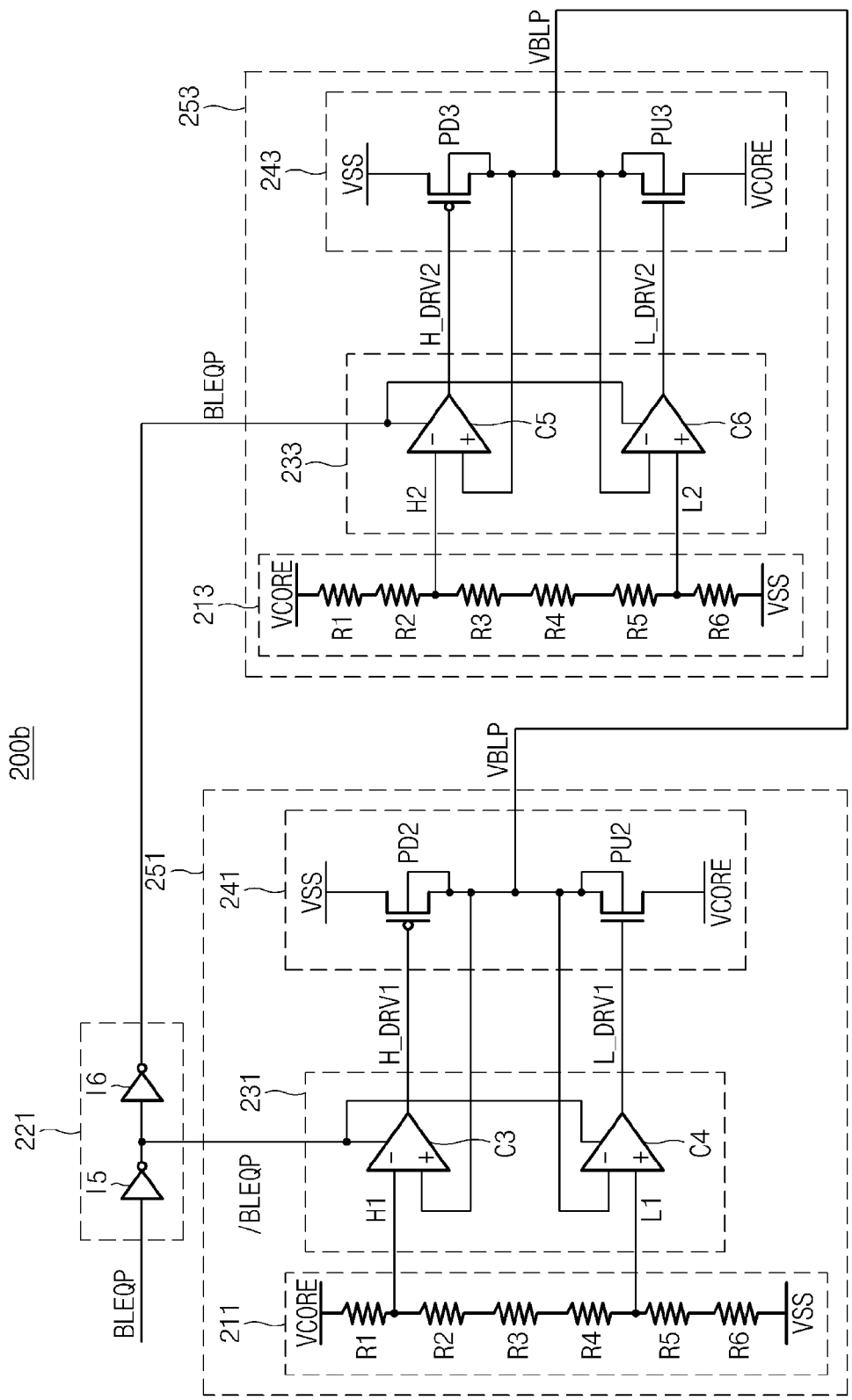
FIG. 4 is a circuit diagram illustrating a representation of an example of a driving circuit in accordance with an embodiment.

Referring to FIG. 4, a circuit diagram illustrating a representation of an example of a driving circuit in accordance with an embodiment is shown.

In FIG. 4, a driving circuit 200b may include sub driving circuits 251 and 253 selectively enabled in response to the voltage region control signal BLEQP and have different dead zones.

The sub driving circuits 251 and 253 are complementarily enabled by receiving an inverted voltage region control signal /BLEQP and the voltage region control signal BLEQP complementarily enabled through a select circuit 221 configured by inverters 15 and 16.

The first sub driving circuit 251 may include a first voltage division circuit 211 which divides a core voltage VCORE and provides a first upper voltage H1 and a first lower voltage L1, a first comparison circuit 231 enabled in response to the inverted voltage region control signal /BLEQP, and first driving devices 241.

The first comparison circuit 231 may include a third comparator C3 and a fourth comparator C4 enabled in response to the inverted voltage region control signal /BLEQP.

The third comparator C3 compares the first upper voltage H1 and an internal voltage VBLP and provides a first upper driving signal H_DRV1. Further, the fourth comparator C4 compares the first lower voltage L1 and the internal voltage VBLP and provides a first lower driving signal L_DRV1.

As FIG. 2, the third comparator C3 provides the first upper driving signal H_DRV1 enabled when the internal voltage VBLP is larger than the first upper voltage H1. The fourth comparator C4 provides the first lower driving signal L_DRV1 enabled when the internal voltage VBLP is smaller than the first lower voltage L1.

The first driving devices 241 provide the internal voltage VBLP in response to the first upper driving signal H_DRV1 and the first lower driving signal L_DRV1, respectively. The first driving devices 241 may include a second pull-down device PD2 which provides a ground voltage VSS to the internal voltage VBLP in response to the first upper driving signal H_DRV1. The first driving devices 241 may also include a second pull-up device PU2 which provides the core voltage VCORE to the internal voltage VBLP in response to the first lower driving signal L_DRV1.

In brief, the first sub driving circuit 251 may have a dead zone between the first upper voltage H1 and the first lower voltage L1, and drive and provide the internal voltage VBLP.

The second sub driving circuit 253 may include a second voltage division circuit 213 which divides the core voltage VCORE and provides a second upper voltage H2 and a second lower voltage L2. The second sub driving circuit 253 may include a second comparison circuit 233 enabled in response to the voltage region control signal BLEQP and configured to compare the internal voltage VBLP with the second upper voltage H2 and the second lower voltage L2, and second driving devices 243.

The second comparison circuit 233 may include a fifth comparator C5 which compares the internal voltage VBLP and the second upper voltage H2 and provides a second upper driving signal H_DRV2. Further, the second comparison circuit 233 may include a sixth comparator C6 which compares the internal voltage VBLP and the second lower voltage L2 and provides a second lower driving signal L_DRV2. The fifth and sixth comparators C5 and C6 may be enabled in response to the voltage region control signal BLEQP.

The second driving devices 243 may include a third pull-down device PD3 which provides the ground voltage VSS to the internal voltage VBLP in response to the second upper driving signal H_DRV2. The second driving devices 243 may also include a third pull-up device PU3 which provides the core voltage VCORE to the internal voltage VBLP in response to the second lower driving signal L_DRV2.

The second sub driving circuit 253 may have a dead zone between the second upper voltage H2 and the second lower voltage L2, and drive and provide the internal voltage VBLP.

The driving circuit 200b described above with reference to FIG. 4 provides the internal voltage VBLP by changing the dead zones through selectively enabling the plurality of sub driving circuits 251 and 253 having the different dead zones. Accordingly, when compared to the driving circuit 200a of FIG. 2 in which upper voltages and lower voltages are provided to comparators by being changed to determine dead zones, a time required to change voltages to be applied to comparators may be shortened accordingly.

Operations of the driving circuit 200b are substantially the same as described above with reference to FIGS. 2 and 3. However, a difference resides in that, in the driving circuit 200b, one of the first upper voltage H1 and the second upper voltage H2 is not selectively provided as the selected upper voltage H_SEL. In the alternative, one of the first lower voltage L1 and the second lower voltage L2 is not selectively provided as the selected lower voltage L_SEL. Instead, selection of the upper voltages H1 and H2 and the lower voltages L1 and L2 is implemented by selecting one of the sub driving circuits 251 and 253.

While it was described herein as an example that one of the two upper voltages H1 and H2 and one of the two lower voltages L1 and L2 are selected, it is to be noted that the embodiment is not limited to such an example. Moreover, it is obvious to a person skilled in the art that a driving apparatus may be realized in such a way as to selectively provide a plurality of upper voltages and a plurality of lower voltages to set a plurality of dead zones.

Figure 5:
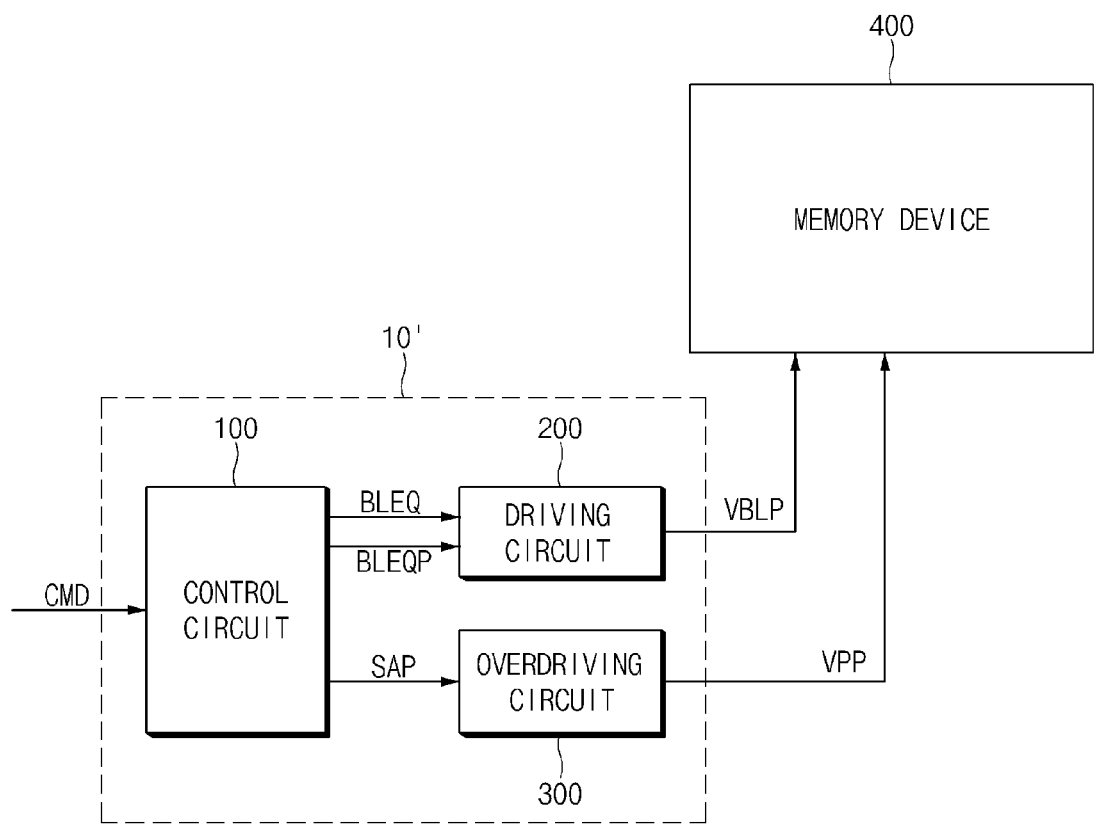
FIG. 5 is a diagram illustrating a representation of an example of a driving apparatus and a memory apparatus in accordance with an embodiment.

Referring to FIG. 5, a diagram illustrating a representation of an example of a driving apparatus and a memory apparatus in accordance with an embodiment is illustrated.

In FIG. 5, a driving apparatus 10' may include a control circuit 100, a driving circuit 200, and an overdriving circuit 300. The driving apparatus 10' of FIG. 5 further includes the overdriving circuit 300 when compared to the driving apparatus 10 of FIG. 1.

As described above with reference to FIG. 3, the overdriving circuit 300 may increase a voltage to be provided to a bit line, to a boosted voltage, in response to an overdriving signal SAP, for a preset time before precharging a bank included in a memory apparatus 400. The overdriving circuit 300 may be configured to temporarily increase a voltage to be provided to memory cells for a preset time before a bank of the memory cells is precharged. According to an embodiment, a boosted voltage VPP may be provided through an RTO line electrically coupled with a sense amplifier (not shown), in response to the overdriving signal SAP.

According to this fact, as the boosted voltage VPP is provided to memory cells in the memory apparatus 400 which are electrically coupled with the bit line, data may be precisely written. In addition, a data retention time may be lengthened.

The memory apparatus 400 may include banks each of which is configured by a plurality of memory cells. In addition to memory cells, the memory apparatus 400 may include the sense amplifier, data input/output elements, an address buffer, and so forth. Further, the memory apparatus may be electrically coupled with the driving circuit 200 and the overdriving circuit 300 through a plurality of bit lines.

The memory apparatus 400 may be provided with an internal voltage VBLP through bit line pairs. As described above, the internal voltage VBLP may be provided by being electrically coupled with the bit line pairs in response to a bit line equalization signal BLEQ.

The overdriving circuit 300 may be electrically coupled with the memory apparatus 400 through the RTO line and an SB line electrically coupled with the sense amplifier. Since the sense amplifier is electrically coupled with a bit line pair in a bank active operation, the overdriving circuit 300 may resultantly provide the boosted voltage VPP to the bit line pair.

As described above, in the driving apparatuses 10 and 10' according to the embodiments, at a time when the internal voltage VBLP increases as an increased current value is applied to the internal voltage VBLP, a dead zone is lowered for a predetermined time, whereby the drivability of a pull-down element may be improved. Accordingly, the internal voltage VBLP which temporarily increases may be stabilized within a short time.

For example, where the internal voltage VBLP corresponds to a bit line precharge voltage which is provided to memory cells through a bit line, because the bit line charge voltage is utilized as a reference to determine the data value of a memory cell, data write and read reliability may be improved due to the stabilization of the internal voltage VBLP.

While various embodiments have been described above, it will be understood to those skilled in the art that the embodiments described are by way of example only. Accordingly, the driving apparatus described should not be limited based on the described embodiments above.

What is claimed is:

1. A driving apparatus comprising:
    a control circuit configured to generate a voltage region control signal enabled for a predetermined time according to a command signal; and
    a driving circuit configured to provide an internal voltage by selecting a dead zone of the internal voltage according to the voltage region control signal.

2. The driving apparatus according to claim 1, wherein the control circuit generates the voltage region control signal enabled for the predetermined time from a time when a bank of memory cells to be provided with the internal voltage is precharged according to the command signal.

3. The driving apparatus according to claim 2, wherein the control circuit generates the voltage region control signal based on a bit line equalization signal generated according to the command signal.

4. The driving apparatus according to claim 2, wherein the driving circuit comprises:
    a voltage division circuit configured to divide a core voltage, and provide a plurality of upper voltages and a plurality of lower voltages;
    a driving range select circuit configured to provide one of the upper voltages as a selected upper voltage and one of the lower voltages as a selected lower voltage according to the voltage region control signal;
    a comparison circuit configured to compare the selected upper voltage and the selected lower voltage with the internal voltage and generate an upper driving signal and a lower driving signal; and driving devices configured to provide the internal voltage in response to the upper driving signal and the lower driving signal, respectively.

5. The driving apparatus according to claim 4, wherein the driving devices comprise:
   a pull-down device electrically coupled between a ground voltage and the internal voltage, and configured to operate in response to the upper driving signal; and
   a pull-up device electrically coupled between the core voltage and the internal voltage, and configured to operate in response to the lower driving signal.

6. The driving apparatus according to claim 4, wherein the control circuit determines the predetermined time during which the voltage region control signal is enabled according to at least one of a reaction speed of the comparison circuit and sizes of the driving devices.

7. The driving apparatus according to claim 2, wherein the driving circuit provides the internal voltage by decreasing an upper potential and a lower potential of the dead zone while retaining a range of the dead zone according to the voltage region control signal.

8. The driving apparatus according to claim 2, wherein the internal voltage corresponds to a bit line precharge voltage.

9. The driving apparatus according to claim 8, further comprising:
   a memory apparatus including banks of memory cells electrically coupled with driving circuits through a plurality of bit lines.

10. The driving apparatus according to claim 9, further comprising:
    an overdriving circuit configured to temporarily increase a voltage to be provided to memory cells for a preset time before a bank of the memory cells is precharged.

11. The driving apparatus according to claim 2, wherein the driving circuit comprises a plurality of sub driving circuits selectively enabled in response to the voltage region control signal with different dead zones.

12. The driving apparatus according to claim 11, wherein the plurality of sub driving circuits are complementarily enabled according to the voltage region control signal.

13. The driving apparatus according to claim 11, wherein each of the sub driving circuits comprises:
    a voltage division circuit configured to divide the core voltage, and provide an upper voltage and a lower voltage;
    a comparison circuit configured to compare the upper voltage and the lower voltage with the internal voltage in response to the voltage region control signal, and generate an upper driving signal and a lower driving signal; and
    driving devices configured to provide the internal voltage in response to the upper driving signal and the lower driving signal, respectively.

14. The driving apparatus according to claim 13, wherein the driving devices comprise:
    a pull-down device electrically coupled between a ground voltage and the internal voltage, and configured to operate according to the upper driving signal; and
    a pull-up device electrically coupled between the core voltage and the internal voltage, and configured to operate according to the lower driving signal.

15. The driving apparatus according to claim 13, wherein the plurality of sub driving circuits set the dead zones between different upper voltages and lower voltages, and differences between the upper voltages and the lower voltages are equivalent.

16. A driving apparatus comprising:
    a control circuit configured to decode a command signal and generate a voltage region control signal enabled from a predetermined time from when a bank of memory cells to which an internal voltage is provided is precharged; and
    a driving circuit configured to select a dead zone of the internal voltage according to the voltage region control and provide the internal voltage according to the selected dead zone.

17. The driving apparatus according to claim 16, wherein the internal voltage corresponds to a bit line precharge voltage that is configured to serve as a reference value to determine a high data value or a low data value or a start voltage to write data in the memory cells through a bit line.

18. A driving apparatus comprising:
    a control circuit configured to generate a voltage region control signal and control a time through which the voltage region control signal is enabled according to device characteristics; and
    a driving circuit configured to selectively change a dead zone region to drive an internal voltage for a predetermined time from when a bank is started to be precharged through a bit line in response to the voltage region control signal.

19. The driving apparatus according to claim 18, further comprising:
    driving devices configured to pull down the internal voltage to a level of a ground voltage and pull up the internal voltage to a level of a core voltage according to an upper driving signal and a lower driving signal.

20. The driving apparatus according to claim 19, wherein the driving devices are configured to not operate between a selected lower voltage and a selected upper voltage, wherein a region between the selected lower voltage and the selected upper voltage is the dead zone region.

* * * * *